United States Patent
Kim et al.

(10) Patent No.: US 7,839,374 B2
(45) Date of Patent: Nov. 23, 2010

(54) LIQUID CRYSTAL DISPLAY DEVICE AND METHOD OF DRIVING THE SAME

(75) Inventors: Binn Kim, Seoul (KR); Su Hwan Moon, Gumi-si (KR); Soo Young Yoon, Goyang-si (KR)

(73) Assignee: LG. Display Co., Ltd., Seoul (KR)

( * ) Notice: Subject to any disclaimer, the term of this patent is extended or adjusted under 35 U.S.C. 154(b) by 913 days.

(21) Appl. No.: 11/172,047

(22) Filed: Jun. 30, 2005

(65) Prior Publication Data

US 2006/0061535 A1    Mar. 23, 2006

(30) Foreign Application Priority Data

Sep. 23, 2004    (KR) ............... 10-2004-0076457

(51) Int. Cl.
  *G09G 3/36*    (2006.01)
(52) U.S. Cl. .................... 345/100; 345/98; 345/99
(58) Field of Classification Search ........... 345/98–100
See application file for complete search history.

(56) References Cited

U.S. PATENT DOCUMENTS

| | | | | |
|---|---|---|---|---|
| 4,830,466 A | * | 5/1989 | Matsuhashi et al. | ......... 349/143 |
| 5,222,082 A | * | 6/1993 | Plus | ............................. 377/79 |
| 5,410,583 A | * | 4/1995 | Weisbrod et al. | .............. 377/75 |
| 5,949,398 A | * | 9/1999 | Kim | ............................ 345/100 |
| 6,300,928 B1 | * | 10/2001 | Kim | ............................. 345/92 |
| 2003/0128180 A1 | * | 7/2003 | Kim et al. | ................... 345/100 |
| 2004/0119671 A1 | * | 6/2004 | Kim et al. | ..................... 345/87 |
| 2004/0217935 A1 | * | 11/2004 | Jeon et al. | ................... 345/100 |
| 2005/0078076 A1 | * | 4/2005 | Kim et al. | ...................... 345/98 |

FOREIGN PATENT DOCUMENTS

CN    1601596    3/2005

* cited by examiner

*Primary Examiner*—Alexander Eisen
*Assistant Examiner*—Stuart McCommas
(74) *Attorney, Agent, or Firm*—Brinks Hofer Gilson & Lione

(57) ABSTRACT

Disclosed herein are a liquid crystal display device, in which a bi-directional internal gate drive circuit is used to cut the number of data lines in half, and a method of driving such liquid crystal display devices. The liquid crystal device includes a pixel array having a plurality of pixels on a lower substrate. The pixels are configured such that two pixels horizontally adjacent to each other are paired to share the same data line. First and second gate drive circuits are housed in the left and right sides of the lower substrate so as to be independently operated in the left and right side of the pixel array. The first gate drive circuit is formed of first to $n^{th}$ odd shift registers, and the second gate drive circuit is formed of first to $n^{th}$ even shift registers.

13 Claims, 9 Drawing Sheets

LIQUID CRYSTAL DISPLAY DEVICE AND METHOD OF DRIVING THE SAME

PRIORITY CLAIM

This application claims the benefit of Korean Patent Application No. P2004-76457, filed on Sep. 23, 2004, which is hereby incorporated by reference as if fully set forth herein.

BACKGROUND OF THE INVENTION

1. Field of the Invention

The present invention relates to a liquid crystal display device, and more particularly, to a liquid crystal display device, in which the number of data lines can be reduced, using a bi-directional internal gate drive circuit.

2. Discussion of the Related Art

Efforts have recently been made to research flat panel display devices such as liquid crystal displays (LCDs), plasma display panels (PDPs), electro-luminescent displays (ELDs), vacuum fluorescent displays (VFDs), and the like. Some types of such flat panel display devices are being practically applied to various appliances for display purposes.

LCDs have been used as a substitute for cathode ray tubes (CRTs) in association with mobile image display devices owing to their characteristics and advantages superior picture quality, lightness, thinness, and low power consumption. Various applications of LCDs are being developed in association with not only mobile image display devices such as laptop computer monitors but also TV monitors to receive and display broadcast signals.

FIG. 1 is a block diagram showing a general active matrix liquid crystal display (LCD) device. As shown in FIG. 1, the general active matrix LCD includes a liquid crystal display panel 1 for displaying images. In the vertical and horizontal end portions of the liquid crystal display panel 1 are provided, respectively, a signal line drive circuit 2 and a scan line drive circuit 3 for driving the liquid crystal display panel 1. Control signals for controlling the signal line drive circuit 2 and the scan line driver circuit 3 are generated from a timing generation circuit 5. Various control signals are generated from a dot clock (CLK), a horizontal synchronization signal (HSYNC), and a vertical synchronization signal (VSYNC) inputted from the outside. In addition, depending on the type of interface between the LCD panel and the input of the signal line drive circuit 2, data processing may need to be performed in order to arrange data according to assigned commands. For this purpose, a data processing circuit 4 may be provided, which is also controlled through the timing generation circuit 5. Usually, the data processing circuit 4 and the timing generation circuit 5 are developed in an integrated form as an ASIC (application specific integrated circuit).

The above-mentioned general liquid crystal display device generally includes a liquid crystal display panel for displaying an image signal and a drive circuit for applying drive signals to the liquid crystal display panel from an external source.

Although not shown in FIG. 1, the liquid crystal display panel 1 comprises two transparent substrates (glass substrates) bonded to each other so as to have a certain space between the two transparent substrates. Located within this space is a liquid crystal layer. In one of the two transparent substrates are formed a plurality of gate lines G1, G2, G3, . . . , Gn arranged at certain regular intervals, a plurality of data lines S1, S2, S3, . . . , Sn arranged at certain regular intervals perpendicularly to the gate lines, a plurality of pixel electrodes formed in array pixel areas, arranged in rows and columns, defined by the gate lines, the data lines, and a plurality of thin film transistors (TFT) The TFTs may be located at the intersections of the gate lines and the data lines for applying the data line signals to pixel electrodes according to the gate line signals. Located in the other transparent substrate are a color filter layer, a common electrode (VCOM), and a black matrix layer.

As a turn-on signal is sequentially applied to each gate line, a data signal is applied to pixel electrodes corresponding to the gate line. The biased pixels cause an image to be displayed.

In the above-constructed TFT LCD device, TFTs are employed as switching elements for turning on and off the pixels inside the device. Switching the TFTs on and off switches corresponding pixels on and off.

In a general TFT liquid crystal display device, cells constituting pixels are arranged in the form of an array with the pixels arranged in rows and columns. Each cell is formed of a switching TFT, a liquid crystal cell, and a storage capacitor (CSTG). The sources of the TFTs are connected in common in columns to form data lines S1 to Sn, which are connected to a source driver at connections $S_1'$, $S_2'$, . . . , $S_N'$. The gates of the TFTs are connected in common in rows to form gate lines G1 to GM, which are connected to a gate driver at connections $G_1'$, $G_2'$, . . . , $G_n'$. In this manner, an N×M resolution (for example, SVGA (800×600), XGA (1024×768), UXGA (1600×1200)) is realized in the display devices.

The source driver is also known as a data driver, a column driver, or a signal line drive circuit, and the gate driver is also referred to as a row driver, a scan driver, or a scan line drive circuit. Hereinafter, the source driver is referred to as a "signal line drive circuit," and the gate driver is referred to as a "scan line driver circuit."

One side of the liquid crystal cell is connected to the TFT drain through the pixel electrode, and the other side is connected to a common electrode. The pixel electrode is formed of a transparent conductive indium tin oxide (ITO). When an on-signal is applied to the TFT gate, a signal voltage applied through the signal line drive circuit is applied to the liquid crystal cell, and the common electrode, also formed of ITO, applies a common voltage (VCOM) to the liquid crystal cell. Storage capacitors (CSTG) function to retain signal voltages applied to the pixel electrodes (pixel ITO) for a certain period of time. These storage capacitors (CSTG) also control the light transmissivity of individual pixels by changing the arranged states of liquid crystal cells through charging and discharging. One side of the storage capacitor (CSTG) may be connected to a separate electrode or a gate electrode. A structure, in which the storage capacitor is connected with a gate electrode, is referred to as a storage-on-gate structure.

Recently, an LCD device employing TFTs has been used as a display device for laptop computers, and therefore cost reduction is desired. One way to realize a low-price LCD device is to reduce the material cost. Additionally, the cost reduction of a driver integrated circuit (IC) for driving signal lines of a liquid crystal panel can reduce the production cost of the entire LCD device. Signal line driver ICs account for most of the material cost of an LCD device because of their advanced operational function and the large number of driver ICs that are required. For example, where one driver IC provides 240 outputs, 10 driver ICs are needed for an SVGA panel. The reduction in the number of driver ICs has been proposed in Japanese Laid-open Patent Publication Nos. 3-38689, 5-265045, and 6-148680. All of these approaches attempt to cut the number of the signal driver ICs in half by allowing neighboring pixels to share the signal lines in the liquid display panel.

FIG. 2 shows a portion of a circuit utilizing a conventional technique for cutting in half the number of signal drivers used in a conventional LCD device. FIG. 3 shows an operation waveform for the LCD circuit of FIG. 2.

As shown in FIG. 2, the conventional LCD device comprises a plurality of gate lines arranged in one direction; pairs of two neighboring pixels (first and second pixels (A, B) (C, D)) connected to one data line; a first transistor T1 receiving a signal from each gate line which turns the transistor on or off; a second transistor T2, receiving a signal from a subsequent gate line, which turns transistor T2 on or off, such that when transistors T1 and T2 are turned on a data signal transmitted through the data line is transmitted to a first pixel; a third transistor T3 receiving a signal from the gate line, which turns transistor T3 on or off, such that when transistor T3 is turned on, a data signal transmitted through the data line is transmitted to a second pixel; and a storage capacitor $C_{st}$ connected between a previous gate line and each pixel.

The above structure is a data line sharing (DLS) drive structure for driving two neighboring pixels through one data line. In the LCD device using the above DLS driving scheme, one data line is used to apply a data signal to two neighboring pixels and thus the number of data driver ICs can be cut in half.

For DLS driving, a waveform different from conventional waveforms is required. As shown in FIG. 3, a gate waveform having a half-period output waveform before one period of output waveform is employed. A waveform applied to one gate line consists of two waveforms, and the period of a previous waveform is half that of the subsequent waveform.

The operating principle of the above LCD device will now be explained with reference to the figures. As shown in FIGS. 2 and 3, in the case where a gate signal is sequentially applied to the gate lines G(n), G(n+1), G(n+2), if, at the t1 section, one period of "high" signal is applied to the gate line G(n+1) and a half period of "high signal" is applied to the gate line G(n+2), the first and third transistors T1 and T3 receive the gate line G(n+1) signal and are turned on. As the first transistor T1 is turned on, the second transistor T2 receives the gate line G(n+2) signal and is turned on. Thus, a data signal is applied simultaneously, via data lines D(m), D(m+1), D(m+2), etc. to the first and second pixels A and B.

At the t2 section, after a half-period, the second transistor T2 is turned off because gate line G(n+2) is at a low signal, and the first and third transistors T1 and T3 remain turned on. Thus, the first pixel A retains the already-applied data signal, and the second pixel B can receive another data signal. In this manner, using one data line, two different data signals can be sequentially applied to two neighboring pixels.

As described above, using a next gate line signal having a half period, a data signal can be applied selectively to two different pixels adjacent to each other. This driving method can cut the number of data lines in half, as compared with a general data driving method where one data line corresponds to one pixel, thus making it possible to cut the number of data driver ICs in half.

However, the application of this data line sharing (DLS) method necessitates a separate gate driver IC, which can successively output a half-period waveform and one period waveform, rather than a general wave. Therefore, even if the number of the data lines is cut in half, a separate gate driver IC must be provided, thus resulting in a limitation in cost reduction.

A circuit utilizing a second conventional technique for cutting in half the number of signal drivers used in a conventional LCD device and its operational waveform diagram are shown in FIGS. 4 and 5, respectively. As shown in FIG. 4, the liquid crystal display panel includes an n×m array of pixel electrodes, where n and m are integers not less than two. Two adjacent odd and even-numbered pixels along a horizontal or row direction share one data line, which is extended in vertical direction. Connected to the shared data line ($S_1, S_2, \ldots, S_{n/2}$) is the drain of a TFT, which is a switching element connected to each pixel. The number of data lines is half that of the horizontally arranged pixels (e.g., n/2).

For explanation and without limitation, the gates of the two neighboring TFTs, may be referred to as odd-numbered TFTs ($d_{m1}, d_{m3}, d_{m5}, \ldots, d_{m(n-1)}$) and as even-numbered TFTs ($d_{m2}, d_{m4}, d_{m6}, \ldots, d_{mn}$), are connected respectively to two different gate lines (G1, G2, . . . , G2n), which are assigned to a horizontal display line that extends in horizontal direction. The number of gate lines is twice the number of vertically arranged pixels (e.g., 2m).

According to the above configuration, however, in an odd-numbered display line (m=1, 3, 5, etc.), the TFT gate of a horizontally odd-numbered pixel is connected to an odd-numbered gate line, and the TFT gate of a horizontally even-numbered pixel is connected to an even-numbered gate line. Further, in an even-numbered display line (m=2, 4, 6, etc.), the TFT gate of a horizontally odd-numbered pixel is connected to an even-numbered gate line, and the TFT gate of a horizontally even-numbered pixel is connected to an odd-numbered gate line. With respect to an arbitrary horizontally-extended display line with a plurality of (for example, two) gate lines assigned thereto, a horizontally odd-numbered TFT gate is connected to one of the two gate lines and a horizontally even-numbered TFT gate is connected to the other gate line. In a display line adjacent to the above display line, the TFT gates and the gate lines are connected in the opposite manner to the previous one. In other words, the odd-numbered display line and the even-numbered display line are opposite to each other in terms of the connection of the TFT gates to the gate lines.

FIG. 5 shows an operational waveform for the LCD circuit of FIG. 4. A data processing circuit (not shown) receives serially inputted data, and one line portion of the received data is written in a line memory formed in the data processing circuit. According to connections between the TFTs, the data lines, and the gate lines of the panel, the data is divided into two parts corresponding respectively to first and second halves of one horizontal period (1H).

In the first row display line (m=1), the first half data is output to odd-numbered data lines S1, S3, S5, . . . , to form a pattern A. The second half data is output to even-numbered data lines S2, S4, S6, . . . , to form a pattern B.

In the second row display line (m=2), the first half is output to odd numbered data lines S1, S3, S5, . . . , but now forms a pattern B, and the second half is output to even numbered data lines S2, S4, S6, . . . , but now forms a pattern A. From the third row display line through the mth row display line, the data output patterns in the above first and second row display lines are repeated. In this manner, if the data is outputted to the data line, the gate lines sequentially apply a TFT-on voltage to corresponding gate lines G1, G2, G3, . . . , so that desired data is written into desired pixels.

Looking at data line S1, if the gate lines are sequentially turned on from the first gate line G1, the data is sequentially written into pixels d11(A), d12(B), d22(B), d21(A), . . . . Here, (A) and (B) denote the pattern A and B respectively.

Signals outputted from neighboring outputs of the signal line drive circuit have opposite polarities to each other. Considering that the polarity is switched for every output, on completion of writing one frame, the polarity on the screen is alternated at two-pixel intervals in horizontal direction and at one-pixel interval in vertical direction. This differs slightly from dot inversion driving in which all neighboring pixels have opposite polarities. In the sense that one pair of pixels consist of two adjacent pixels, they are regarded to have opposite polarities, thereby alleviating screen flicker due to the difference between positive and negative polarities.

In the above-described conventional LCD device, two gate lines are involved in driving odd-numbered pixels and even-numbered pixels in each display line. Thus, since one display line is driven by means of two gate lines, the LCD device requires twice as many gate lines as an LCD device using one gate line. Accordingly, in order for all the doubled gate lines to be driven during one frame, the charging time for one pixel is reduced to H/2 from 1H, and thus an effective charging time for each pixel cannot be easily achieved.

SUMMARY OF THE INVENTION

A liquid crystal display device, and a method of driving a liquid crystal display device, provides a bi-directional internal gate drive circuit which reduces the number of data lines without decreasing the effective pixel charging time. Half of the liquid crystal display device may be driven by one gate driving circuit while the other half of the liquid crystal display device is driven by another gate driving circuit that operates independent of the first gate driving circuit.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE INVENTION

A liquid crystal display device may drive one or more pixels through the use of a first gate drive circuit and a second gate drive circuit that are operated independently of one another. By driving some of the pixels with one gate drive circuit and driving other pixels with another gate drive circuit, the pixels can be driven without increasing the gate driving speed.

Additionally, by implementing a DLS technology in connection with the first gate drive circuit and the second gate drive circuit, the number of gate lines can be cut in half without any external drive IC for performing gate driving and without reducing the effective pixel charging time.

Figure 1:
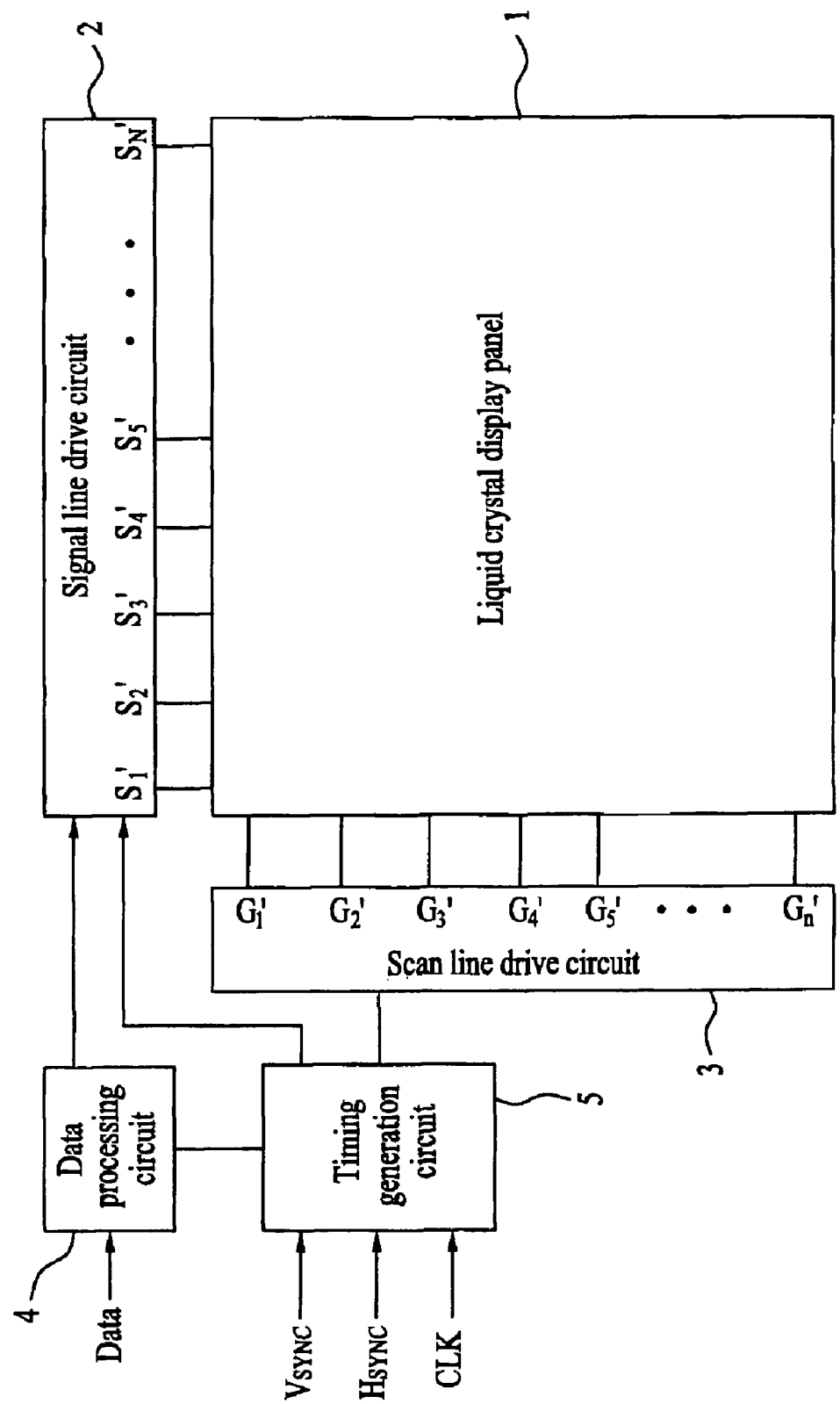
FIG. 1 is a block diagram showing a general LCD device.
Figure 2:
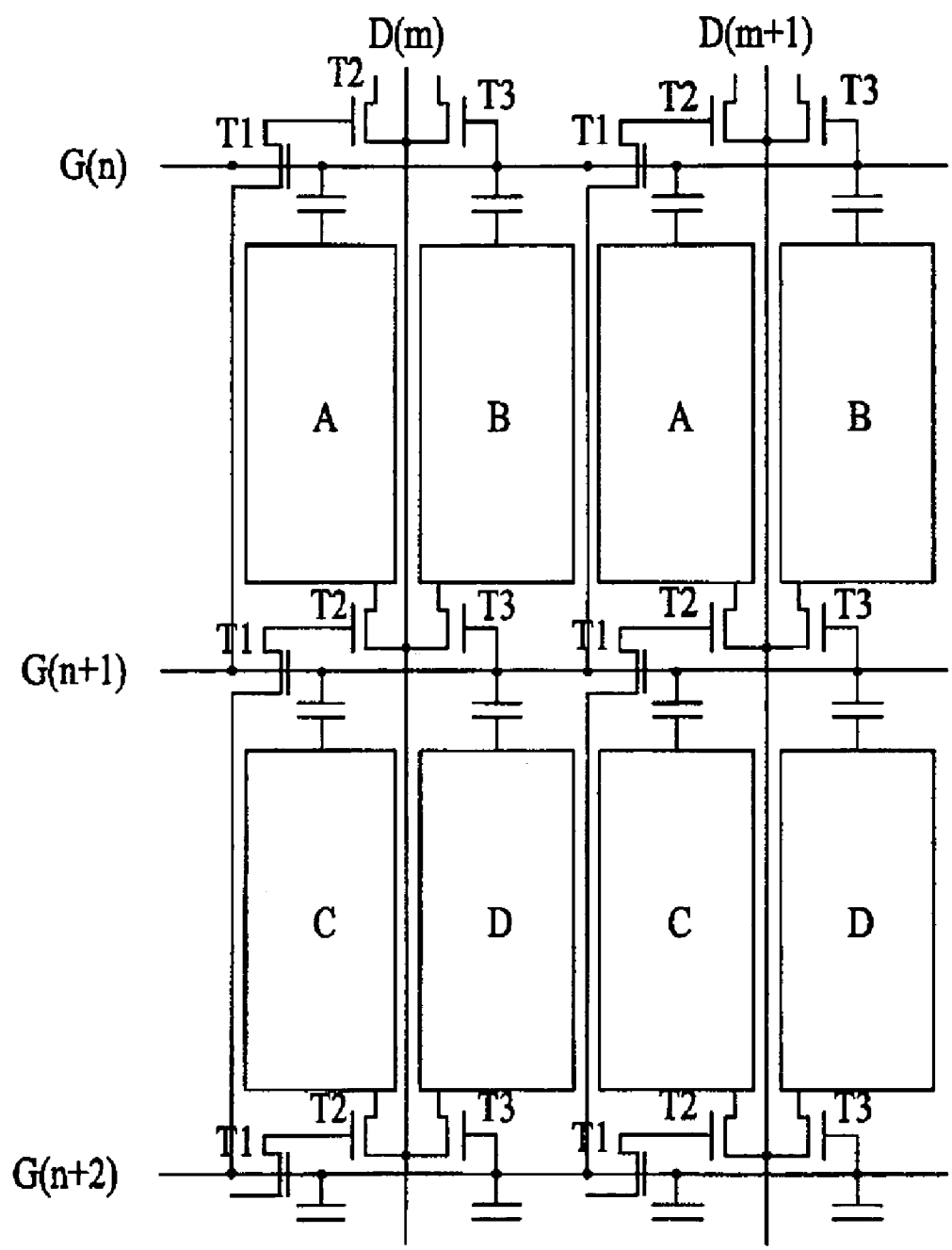
FIG. 2 is a portion of a circuit utilizing a conventional technique for cutting in half the number of signal drivers used in a conventional LCD device.
Figure 3:
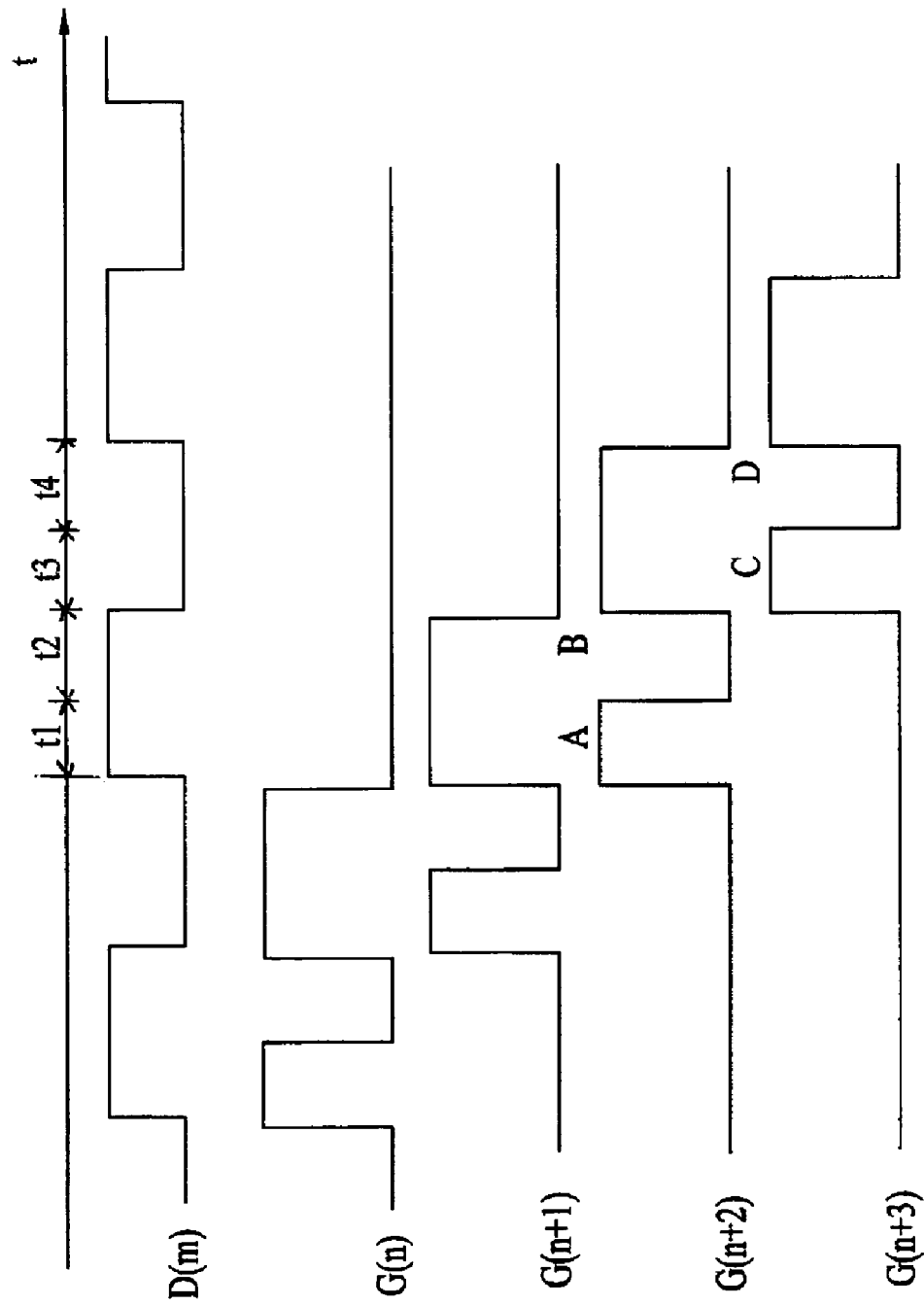
FIG. 3 shows an operational waveform for the LCD device of FIG. 2.
Figure 4:
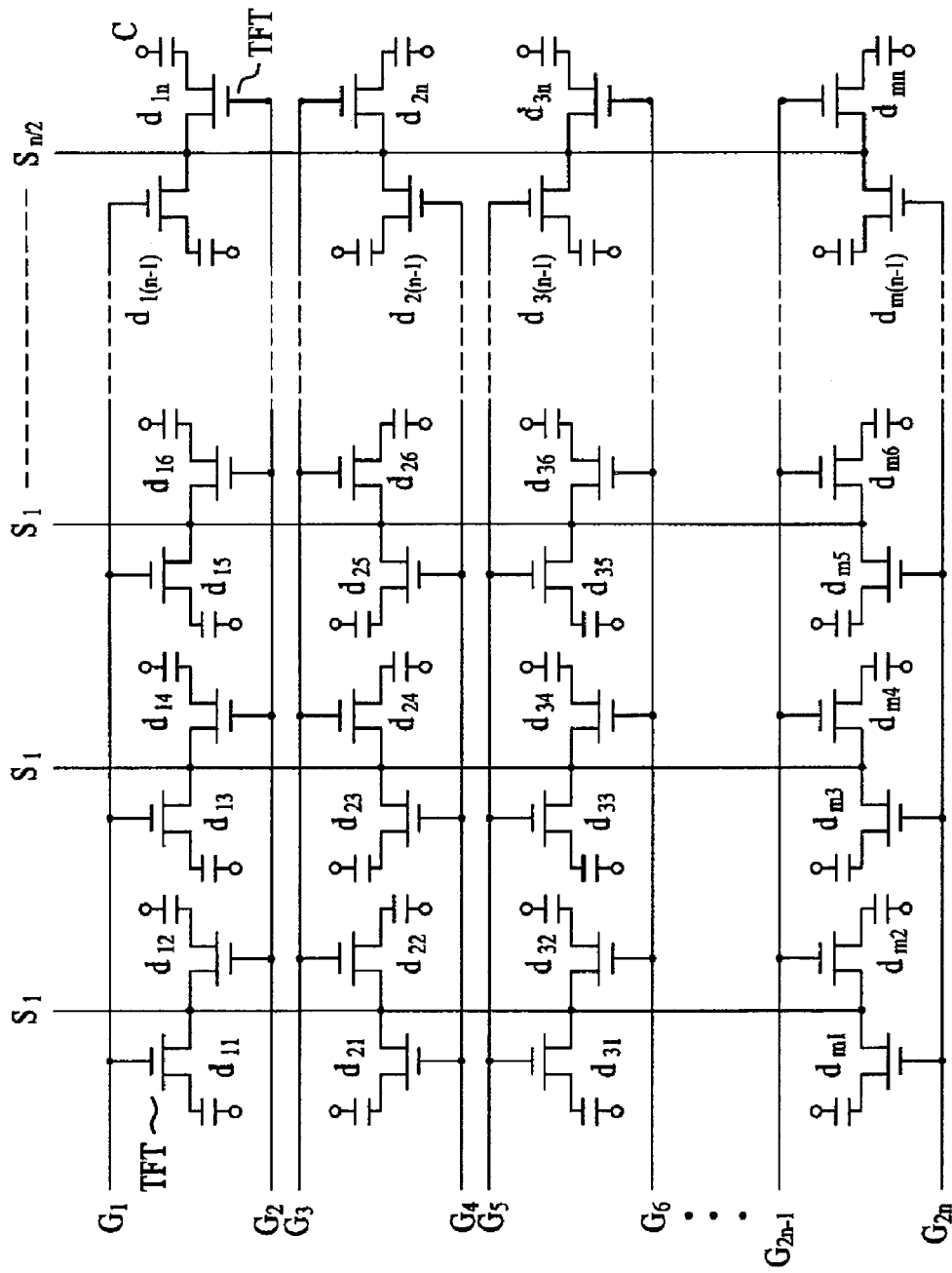
FIG. 4 is a portion of a another circuit utilizing a second conventional technique for cutting in half the number of signal drivers used in a conventional LCD device.
Figure 5:
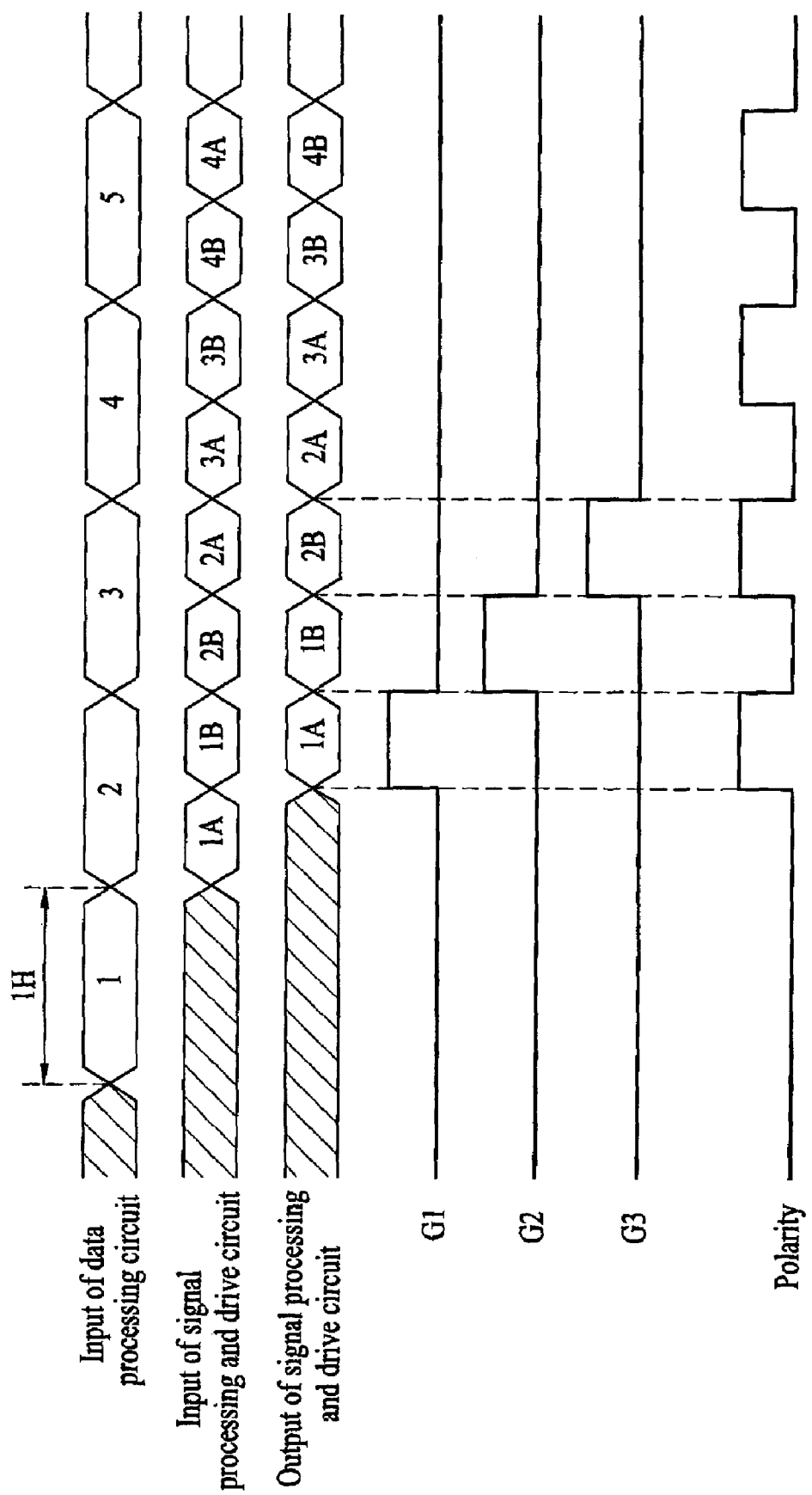
FIG. 5 shows an operational waveform for the LCD device of FIG. 4.
Figure 6:
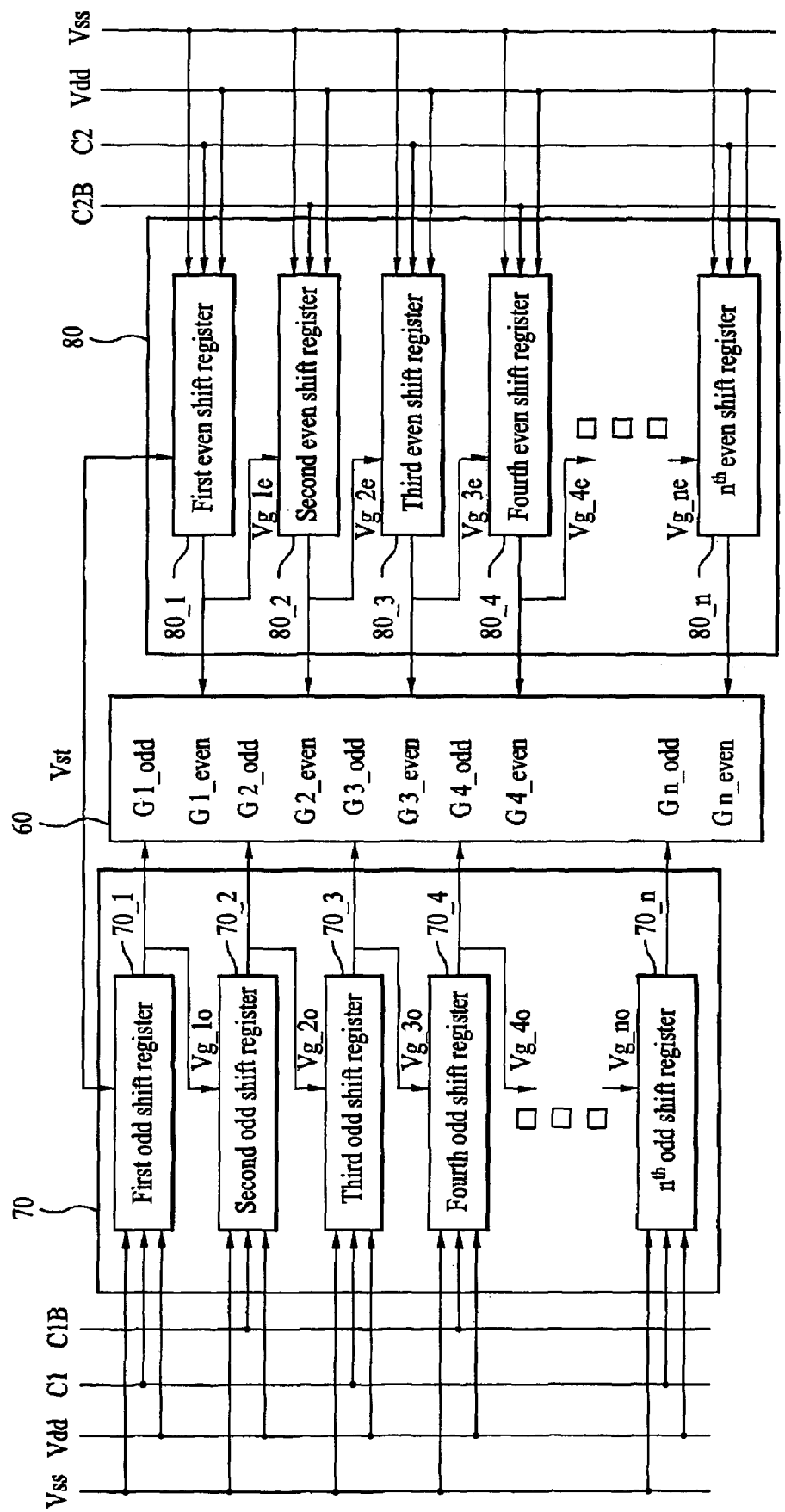
FIG. 6 is a block diagram illustrating the construction of a liquid crystal display.
Figure 7:
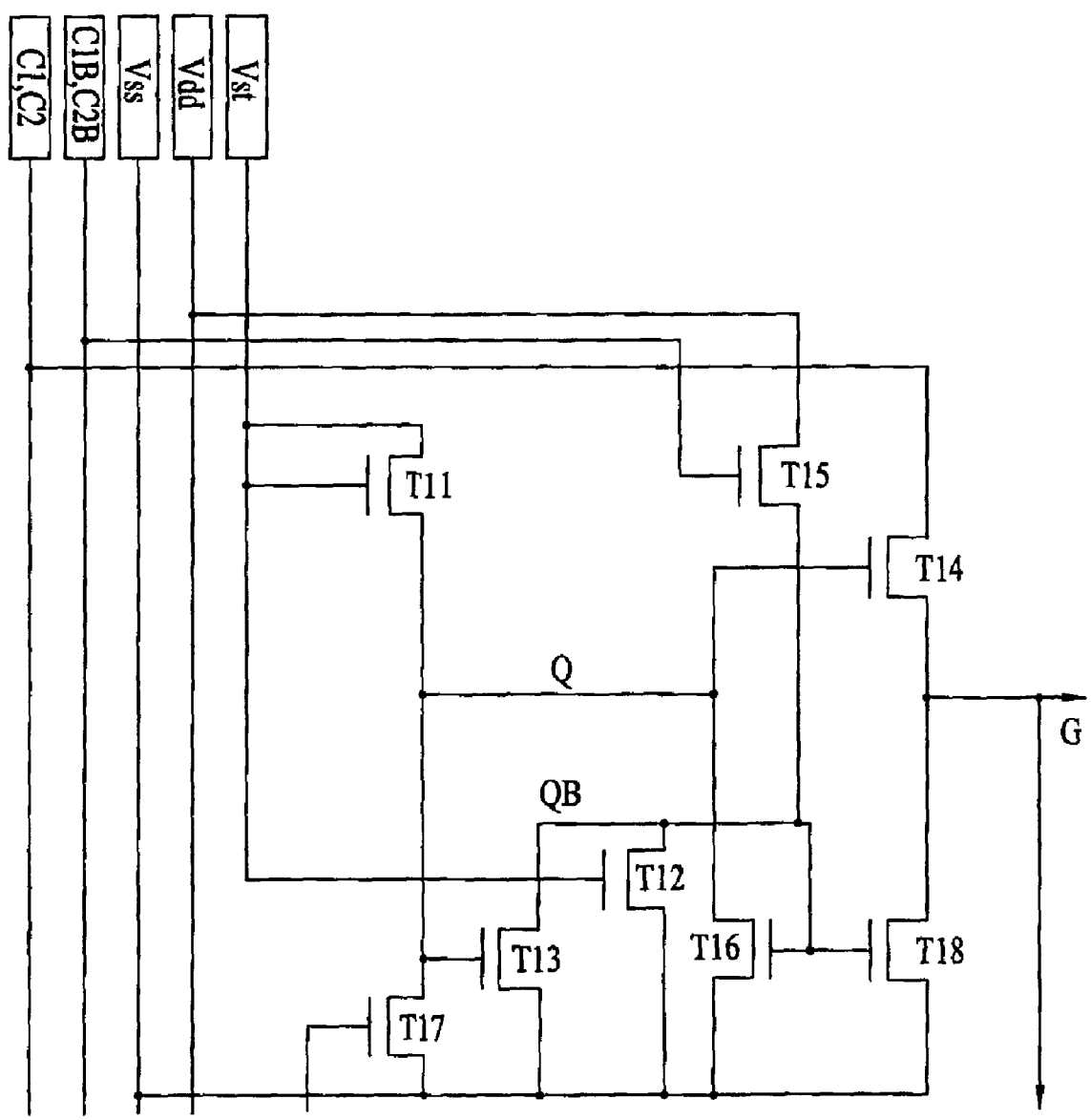
FIG. 7 is a circuit diagram of each shift register in FIG. 6.

FIG. 6 is a block diagram illustrating the construction of a liquid crystal display. FIG. 7 is a circuit diagram of each shift register in FIG. 6, and FIG. 8 is a block diagram illustrating the construction of a pixel array, in rows and columns, shown in FIG. 6.

The liquid crystal display (LCD) device may include a gate drive circuit housed in a first section of a substrate, which may be on one of the side portions of the substrate, and a gate drive circuit housed in a second section of the substrate, which may be a different side portion of the substrate. The liquid crystal display device may implement a data line sharing (DLS) technology. As illustrated in FIG. 6, the LCD device may include a pixel array 60, and first and second gate drive circuits 70 and 80 which may be located on different sides of the pixel array 60. For explanation and with limitation, the first drive circuit 70 may be located on the left of the pixel array 60 and the second drive circuit 80 may be located on the right of the pixel array 60.

Figure 8:
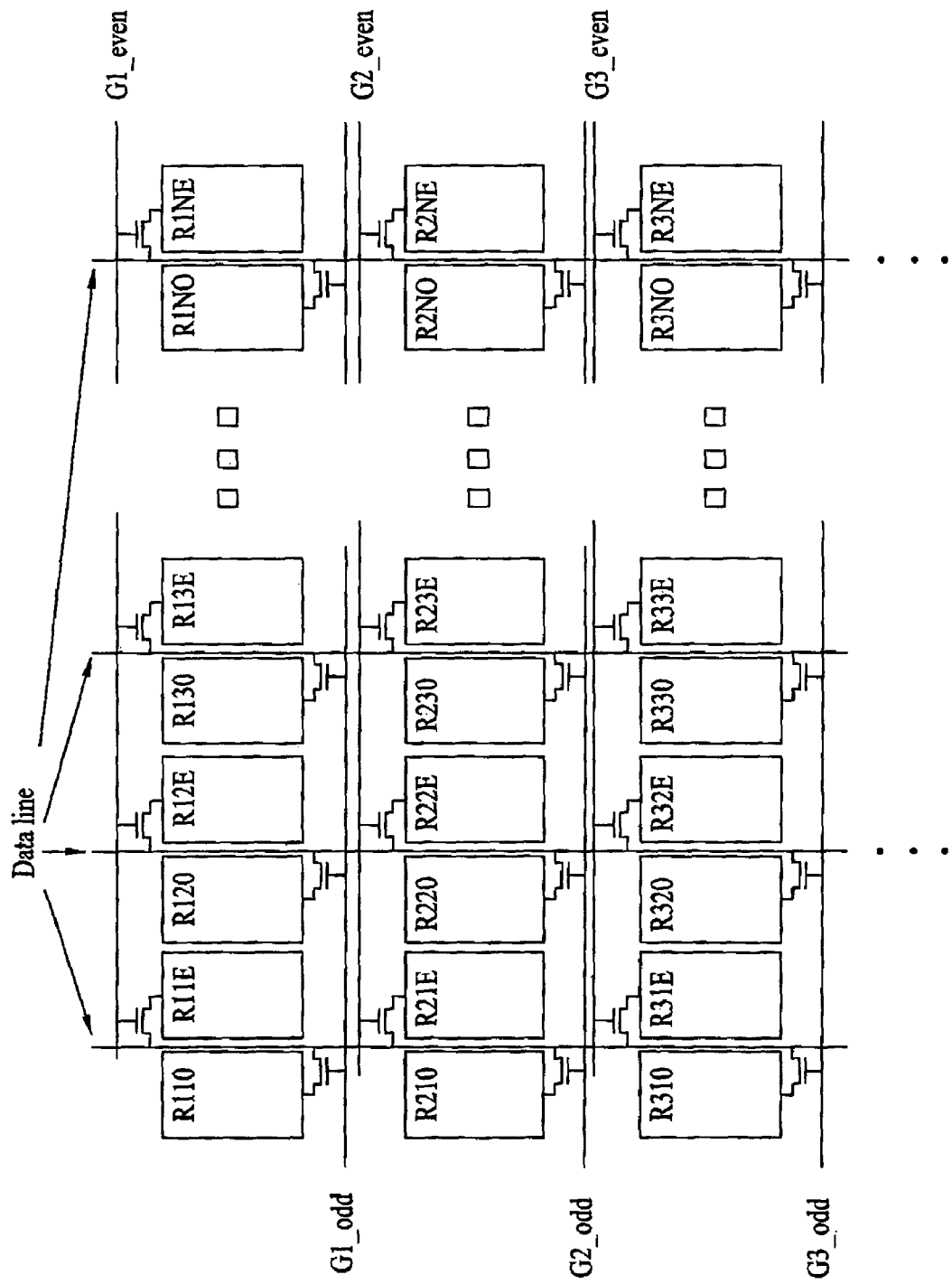
FIG. 8 is a block diagram illustrating the construction of a pixel array in FIG. 6.

As shown in FIG. 8, the pixel array 60 is configured such that pixels selected from a first group of a plurality of pixels, and pixels selected from a second group of a plurality of pixels may be arranged adjacent to each other to form a pair of pixels that may share a data line. For explanation and without limitation, the pixels selected from a first group of a plurality of pixels will be referred to as odd-numbered pixels and the pixels selected from the second group of a plurality of pixels will be referred to as even-numbered pixels. Additionally, for explanation and without limitation, pixels that are arranged adjacent to one another may be arranged in a horizontal or row direction with the shared data line vertically located between the two adjacent pixels. It is to be understood that other configurations could be derived. Between each of the horizontal rows of pixels lines there may be arranged a gate line connected to the first gate drive circuit and a gate line connected to the second gate drive circuit. For explanation and without limitation, the gate lines connected to the first gate drive circuit may be referred to as odd-numbered gate lines and the gate lines connected to the second gate drive circuit may be referred to as even-numbered gate lines (e.g. G1_odd and G2_even, G2_odd and G3_even, etc.).

To each pixel is connected a switching element (TFT) for applying a data signal. The drain electrode of the switching element (TFT) is connected to the data line, and the source electrode is connected to each pixel electrode. Each switching element (TFT) is connected to a pixel. A TFT connected to a horizontally odd-numbered pixel may be connected to an odd numbered gate line, and a TFT connected to a horizontally even-numbered pixel may be connected to an even-numbered gate line. Each group of gate lines may be assigned to one horizontal display line. Thus there are twice as many gate lines as there are vertically arranged pixels (e.g. R11O, R11E, R12O, R12E, etc.).

Additionally, a pair of horizontally adjacent pixels may share one vertical (column) data line. Thus there are half as many data lines as horizontally arranged pixels.

The first and second drive circuits 70 and 80 may be housed to the left and right side of the pixel array 60, and configured so as to apply a gate drive signal independently to the odd-numbered pixels and the even-numbered pixels in the pixel array 60.

A scan start signal Vst, clock signals of two phases C1 and C1B, and VDD and VSS signals are applied to the first gate drive circuit 70. To the second gate drive circuit 80 are applied a scan start signal Vst, clock signals of two phases C2 and C2B, and VDD and VSS signals.

The first and second gate drive circuits 70 and 80 may be housed in the lower substrate to the left and right of the pixel array 60. The first and second gate drive circuits 70 and 80 comprise first to $n^{th}$ odd shift registers 70_1~70_n, and first to $n^{th}$ even shift registers 80_1~80_n, respectively. Each shift register constituting each gate drive circuit may include amorphous silicon transistors.

The first to $n^{th}$ odd shift register 70_1~70_n output a gate signal to the odd-numbered gate lines of the pixel array 60, and receive a scan start signal Vst or an output signal of a previous shift register, clock signals of two phases C1 and C1B, and VDD and VSS signals. The first odd shift register 70_1 is configured so as to receive the scan start signal Vst. The second to $n^{th}$ odd shift registers 70_2 to 70_n are configured so as to sequentially receive the output signal from a previous shift register.

The first to $n^{th}$ even shift registers 80_1~80_n output gate signals to even-numbered gate lines of the pixel array 60, and receive a scan start signal Vst or an output signal of a previous shift register, clock signals of two phases C2 and C2B, and VDD and VSS signals. The first even shift register 80_1 is configured so as to receive the scan start signal Vst. The second to $n^{th}$ even shift registers 80_2 to 80_n are configured so as to sequentially receive the output signal from a previous shift register.

Each of the first to $n^{th}$ odd and even shift registers comprises first to eighth resisters T11~T18, as illustrated in FIG. 7, and each includes a pull-up driver, a pull-down driver, a pull-up section, and a pull-down section. Each of the first to eighth transistors T11~T18 may be an amorphous silicon transistor.

The pull-up driver includes a first transistor T11 diode having a gate and drain commonly connected to a scan start signal Vst and a source connected to a Q node; a second transistor T12 having a gate connected to the Vst signal, a drain connected to a QB node and a source connected to a ground voltage terminal Vss; and a third transistor T13, having a gate connected to the Q node, a drain connected to the QB node, and a source connected to the ground voltage terminal Vss.

The pull-up section includes a fourth transistor T14 having a gate connected to the Q node, a drain connected to one of a first or second clock signal C1 or C2, and a source connected to the gate output signal terminal G.

The pull-down driver includes a fifth transistor T15 having a gate connected to one of a third or fourth clock signal C1B or C2B, a drain connected to a Vdd terminal, and a source connected to the QB node; a sixth transistor T16 having a gate connected to the QB node, a drain connected to the Q node, and a source connected to the ground voltage terminal Vss; and a seventh transistor T17 having a gate connected to an output signal of a subsequent stage, a drain connected to the Q node, and a source connected to the ground voltage terminal Vss.

The pull-down section includes an eighth transistor T18 having a gate connected to the QB node, a drain connected to the gate output signal terminal G, and a source connected to the ground voltage terminal Vss.

A circuit construction for each shift register, which constitutes the first and second drive circuits 70 and 80, is illustrated in FIG. 7, but various other circuit configurations may be employed.

A method of driving a liquid crystal display device according to an embodiment of the invention will be described.

Figure 9A:
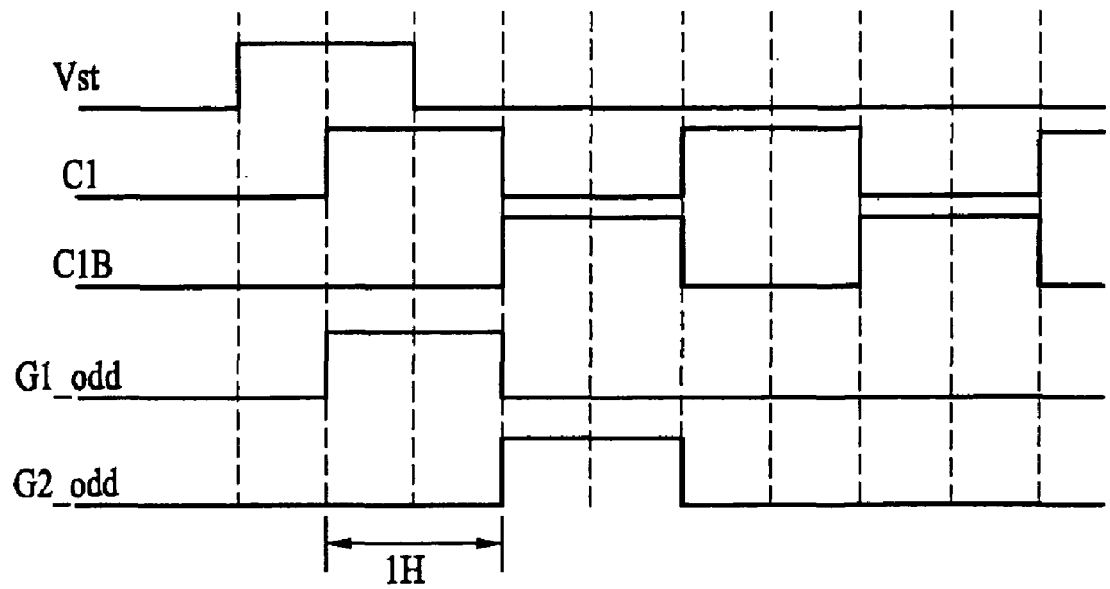
FIGS. 9A and 9B are timing diagrams of a bi-directional internal gate drive circuit for performing gate driving according to the invention.
Figure 9B:
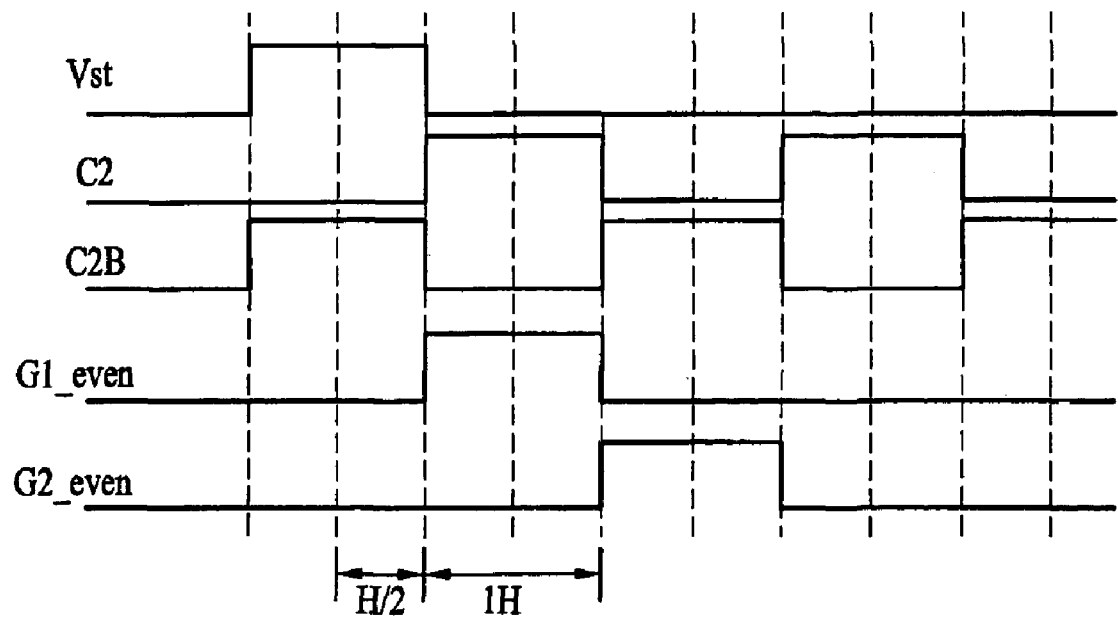

FIGS. 9A and 9B are timing diagrams of a bi-directional internal gate drive circuit that may be used to drive the shift register stages of FIG. 7 used in the LCD device of FIG. 6.

In the LCD display shown in FIG. 8 odd and even-numbered gate line arranged between horizontal lines of pixels are sequentially driven respectively by first and second gate drive circuits 70 and 80. The first and second gate drive circuits 70 and 80 drive, respectively, the odd and even-numbered pixels in an independent manner.

For explanation and without limitation, the odd-numbered pixels of the first line are driven according to the output signal of the first odd shift register 70_1, and then the even-numbered pixels of the first line are driven through the output signal from the first even shift resistor 80-1. The other gate lines of both of the gate drive circuits are then respectively driven.

As illustrated in FIGS. 9A and 9B, with reference to the leading edge of the second clock signal C2, the first clock signal C1 lags clock signal C2 by a predetermined amount of time. Similarly, with respect to the leading edge of fourth clock signal C2B, the third clock signal C1B lags clock signal C2B by a predetermined amount of time. Clock signals C1 and C1B are input into gate drive circuit 70 while the clock signals C2 and C2B are input into gate drive circuit 80. Each clock signal C1, C1B, C2, and C2B may be at a high signal for a time interval H/2 and generate gate output signals having a time interval of H/2 (G1_odd, G1_even), (G2_odd, G2_even), ~, (GN_odd, GN_even). The first gate drive circuit 70 receives Vst or the output signal of a previous stage, C1, C1B, Vdd, and Vss signals. The second gate drive circuit 80 is operated through Vst or the output signal of a previous stage, C2, C2B, Vdd, and Vss signals.

For explanation and without limitation, when the signal G1_odd from the first gate drive circuit 70 is inputted into the first odd-numbered gate line in the pixel array 60, the switching elements (TFTs) connected to the odd-numbered pixels R11O, R12O, ~, R1NO of the first horizontal line are turned on. Thus, the data signals are written in the odd-numbered pixels R11O, R12O, ~, R1NO through the turned-on switching elements (TFTs). After a time period of H/2, when the signal G1_even from the second gate drive circuit 80 is inputted into the first even-numbered gate line in the pixel array 60, the switching elements (TFTs) connected to the even-numbered pixels R11E, R12E, ~, R1NE of the first horizontal line are turned on. Thus, the data signals are written in the even-numbered pixels R11E, R12E, ~, R1NE through the turned-on switching elements (TFTs). In this manner, data is written to each pixel of the pixel array.

If the pixel array 60 is driven by the first and second gate drive circuits 70 and 80 which are operated separately and are housed respectively in the left and right side of the pixel array 60 DLS driving does not increase the driving speed of the gate drive circuit.

More specifically, for the DLS mode, conventionally, the number of gate lines is doubled and thus the gate driving speed must be increased two-fold in order to drive the gates during one frame. In the case where the shift transistor housed in the lower substrate is formed of an amorphous silicon transistor, this increase in the driving speed leads to a difficulty in driving those shift resistors.

The liquid crystal display device may implement DLS driving without increasing the gate driving speed since DLS driving is performed by the first and second gate drive circuits 70 and 80 which are housed in the left and right sides of the lower substrate so as to be separately operated. As illustrated in FIGS. 9A and 9B, the outputs of each drive circuit can be overlapped during operation, and thus the effective pixel charging time can be easily achieved due to the extended waveform of the drive circuit. Here, the above overlap period can be adjusted within 50%.

In the above construction, the housed gate drive circuit can be embodied into any drive circuit of two or more phases.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A liquid crystal display device comprising:
    a substrate, including a plurality of data lines, a plurality of gate lines for receiving gate signals, a pixel array comprising a first group of a plurality of pixels and a second group of a plurality of pixels that the first group of a plurality of pixels and the second group of a plurality of pixels are alternatively arranged, such that the pixel array is configured in a plurality of rows and a plurality of columns across the substrate;
    a first gate drive circuit including a first to an nth shift registers that output first gate signals; and
    a second gate drive circuit including a first to an nth shift registers that output a second gate signals,
    wherein a first pixel selected from the first group of a plurality of pixels and a second pixel selected from the second group of a plurality of pixels share one data line, and the first and second pixel are horizontally adjacent to each other, wherein the first gate drive circuit and the second gate drive circuit are arranged on the substrate and operate independently of one another, wherein the first and second gate drive output odd gate output signals and even gate output signals at time intervals of H/2 respectively to odd-numbered gate lines and even-numbered gate lines of the pixel array independently, and wherein each signal output by the first date drive circuit and the second drive gate circuit has a time duration of about one-half period, wherein each pixel included within the pixel array is connected to a switching element for applying a data signal thereto, a drain electrode of the switching element is connected to a data line, and a source electrode thereof is connected to each pixel electrode,
    where in the first gate drive circuit are applied a scan start signal, clock signals of two phases C1 and C1B, and the second gate drive circuit are applied a scan start signal, clock signals of two phases C2 and C2B, wherein the time interval between the scan start signal and the C1 signal is H/2, wherein the time interval between the C1 signal and the C1B signal is H, and the time interval between the scan start signal and the C2 signal is H, wherein the time interval between the C2 signal and the C2B signal is H,
    where in the C1, C1B, C2, C2B are inputted at time intervals of H/2 into the first and second gate drive circuits and respectively, which thereby generate gate output signals having a time interval of H/2,
    wherein the pair of pixels connected to the same data line are connected to different gate lines among pairs of gate lines, wherein the pair of pixels are concurrently driven for a period of H/2,
    wherein the odd-numbered pixels of the first line are driven according to the gate output signal of the first gate drive circuit, and the even-numbered pixels of the first line are driven for a period of H/2 according to the gate output signal from the second gate drive circuit a period of H/2 later, wherein the pair of pixels are concurrently driven for a period of H/2, then odd-numbered pixels of the first line are non driven and the even-numbered pixels are driven for other period of H/2.

2. The liquid crystal display device as set forth in claim 1, wherein, adjacent pixels that share a data line include a pixel selected from the first group of a plurality of pixels and a pixel selected from the second group of a plurality of pixels, and a gate line driving pixels selected from the first group of a plurality of pixels and a gate line driving pixels selected from the second group of a plurality of pixels are arranged between each of the plurality of rows of pixels.

3. The liquid crystal display device as set forth in claim 1, wherein the number of the data lines is half the number of horizontally arranged pixels.

4. The liquid crystal display device as set forth in claim 1, wherein the first to the $n^{th}$ shift registers of the first gate driver circuit are configured so as to output a gate signal to gate lines selected from the plurality of gate lines that drive pixels selected from the first group of a plurality of pixels.

5. The liquid crystal display device as set forth in claim 1, wherein the first to the $n^{th}$ shift registers of the second gate drive circuit are configured so as to output a gate signal to gate lines selected from the plurality of gate lines that drive pixels selected from the second group of a plurality of pixels.

6. The liquid crystal display device as set forth in claim 1, wherein each of the shift resistors includes:
    a first switch having a source connected to a first node and a gate and drain commonly connected to an output signal of a previous shift register;
    a second switch having a gate connected to the output signal of the previous stage, a drain connected to a second node, and a source connected to a first supply voltage;
    a third switch having a gate connected to the first node, a drain connected to the second node, and a source connected to the first supply voltage;
    a fourth switch having a gate connected to the first node, a drain connected to one of a first and second clock, and a source connected to an output signal of a current stage;
    a fifth switch having a gate connected to one of a third and fourth clock, a drain connected to a second supply voltage, and a source connected to the second node;
    a sixth switch having a gate connected to the second node, a drain connected to a first node, and a source connected to the first supply voltage;
    a seventh switch having a gate connected to an output signal of a subsequent stage, a drain connected to the first node, and a source connected to the first supply voltage; and
    an eighth switch having a gate connected to the second node, a drain connected to the output signal of the current stage, and a source connected to the first supply voltage.

7. The liquid crystal display device as set forth in claim 6, wherein each transistor of the shift register is an amorphous silicon transistor.

8. A liquid crystal display device comprising:
a pixel array arranged on a substrate including a plurality of data line, a plurality of gate line, a first group of a plurality of pixels and a second group of a plurality of pixels that the first group of a plurality of pixels and the second group of a plurality of pixels are alternatively arranged, such that the pixel array is configured in a plurality of groups and a plurality of columns across the substrate;

a first gate drive circuit including a first to an nth shift registers; a second gate drive circuit including a first to an nth shift registers, wherein a first pixel selected from the first group of a plurality of pixels and a second pixel selected from the second group of a plurality of pixels share one data line, and the first and second pixel are horizontally adjacent to each other, wherein the first group drive circuit and the second group drive circuit operate independently such that the first gate drive circuit drives the first group of a plurality of pixels, and the second gate drive circuit drives the second group of a plurality of pixels, wherein the first and second gate drive output odd gate output signals and even gate output signals at time intervals of H/2 respectively to odd-numbered gate lines and even-numbered gate lines of the pixel array independently, and wherein each signal output by the first date drive circuit and the second drive gate circuit has a time duration of about one-half period, wherein each pixel included within the pixel array is connected to a switching element for applying a data signal thereto, a drain electrode of the switching element is connected to a data line, and a source electrode thereof is connected to each pixel electrode, where in the first gate drive circuit are applied a scan start signal, clock signals of two phases C1 and C1B, and the second gate drive circuit are applied a scan start signal, clock signals of two phases C2 and C2B, wherein the time interval between the scan start signal and the C1 signal is H/2, wherein the time interval between the C1 signal and the C1B signal is H, and the time interval between the scan start signal and the C2 signal is H, wherein the time interval between the C2 signal and the C2B signal is H, where in the C1, C1B, C2, C2B are inputted at time intervals of H/2 into the first and second gate drive circuits and respectively, which thereby generate gate output signals having a time interval of H/2, wherein the pair of pixels connected to the same data line are connected to different gate lines among pairs of gate lines, wherein the pair of pixels are concurrently driven for a period of H/2, wherein the odd-numbered pixels of the first line are driven according to the gate output signal of the first gate drive circuit, and the even-numbered pixels of the first line are driven for a period of H/2 according to the gate output signal from the second gate drive circuit a period of H/2 later, wherein the pair of pixels are concurrently driven for a period of H/2, then odd-numbered pixels of the first line are non driven and the even-numbered pixels are driven for other period of H/2.

9. The liquid crystal display device of claim 8, wherein each element of the pixel array is a pair of pixels that share one of the plurality of data lines, one pixel selected from the first group of a plurality of pixels and the other pixel selected from the second group of a plurality of pixels.

10. The liquid crystal display device of claim 9, wherein a pixel selected from the first group of a plurality of pixels is not adjacent to another pixel selected from the first group of a plurality of pixels.

11. The liquid crystal display device of claim 9, wherein a pixel selected from the second group of a plurality of pixels is not adjacent to another pixel selected from the second group of a plurality of pixels.

12. A method of driving a liquid crystal display device comprising:

connecting a first gate drive circuit comprising a plurality of shift register stages arranged from a first stage to an nth stage, in cascade to sequentially output an output signal through an output signal line by using a first voltage supply source, a second voltage supply source, a previous shift register stage's output signal, a next shift register's output signal, and two of a plurality of clock signals;

connecting a second gate drive circuit comprising a plurality of shift register stages arranged from a first stage to an nth stage, in cascade to sequentially output an output signal through an output signal line by using a first voltage supply source, a second voltage supply source, a previous shift register stage's output signal, a next shift register's output signal, and two of a plurality of clock signals;

connecting a substrate, including a plurality of data lines, a plurality of gate lines for receiving gate signals, a pixel array comprising a first group of a plurality of pixels and a second row of a plurality of pixels that the first group of a plurality of pixels and the second group of a plurality of pixels are alternatively arranged, such that the pixel array is configured in a plurality of rows and a plurality of columns across the substrate, wherein a first pixel selected from the first group of a plurality of pixels and a second pixel selected from the second group of a plurality of pixels share one data line, and the first and second pixel are horizontally adjacent to each other;

wherein the first and second gate drive output odd gate output signals and even gate output signals at time intervals of H/2 respectively to odd-numbered gate lines and even-numbered gate lines of the pixel array independently, wherein each signal output by the first date drive circuit and the second drive gate circuit has a time duration of about one-half period, wherein each pixel included within the pixel array is connected to a switching element for applying a data signal thereto, a drain electrode of the switching element is connected to a data line, and a source electrode thereof is connected to each pixel electrode, where in the first gate drive circuit are applied a scan start signal, clock signals of two phases C1 and C1B, and the second gate drive circuit are applied a scan start signal, clock signals of two phases C2 and C2B, wherein the time interval between the scan start signal and the C1 signal is H/2, wherein the time interval between the C1 signal and the C1B signal is H, and the time interval between the scan start signal and the C2 signal is H, wherein the time interval between the C2 signal and the C2B signal is H, where in the C1, C1B, C2, C2B are inputted at time intervals of H/2 into the first and second gate drive circuits and respectively, which thereby generate gate output signals having a time interval of H/2, driving at least one of the pixel array pixels selected from the first group of a plurality of pixels with a signal sequentially output by the shift registers included in the first gate drive circuit;

waiting a predetermined amount of time; and driving at least one of the pixel array pixels selected from the second group of a plurality of pixels with a signal output sequentially by the shift registers included in the second gate drive circuit, wherein the pair of pixels connected to the same data line are connected to different gate lines among pairs of gate lines, wherein the pair of pixels are concurrently driven for a period of H/2, wherein the odd-numbered pixels of the first line are driven according to the gate output signal of the first gate drive circuit, and the even-numbered pixels of the first line are driven for a period of H/2 according to the gate output signal from the second gate drive circuit a period of H/2 later, wherein the pair of pixels are concurrently driven for a period of H/2, then odd-numbered pixels of the first line are non driven and the even-numbered pixels are driven for other period of H/2.

13. The method of driving a liquid crystal display device of claim 12, wherein the predetermined amount of time is about one-fourth of a period.

* * * * *